(12) United States Patent
Mehr et al.

(10) Patent No.: US 10,832,079 B2
(45) Date of Patent: Nov. 10, 2020

(54) DETERMINING AN ARCHITECTURAL LAYOUT

(71) Applicant: DASSAULT SYSTEMES, Velizy Villacoublay (FR)

(72) Inventors: Eloi Mehr, Velizy Villacoublay (FR); Adil Baaj, Velizy Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 266 days.

(21) Appl. No.: 15/975,407

(22) Filed: May 9, 2018

(65) Prior Publication Data

US 2018/0330184 A1 Nov. 15, 2018

(30) Foreign Application Priority Data

May 9, 2017 (EP) ..................................... 17305523

(51) Int. Cl.
| | |
|---|---|
| *G06K 9/46* | (2006.01) |
| *G06K 9/66* | (2006.01) |
| *G06T 17/00* | (2006.01) |
| *G06F 30/13* | (2020.01) |
| *G06T 7/143* | (2017.01) |
| *G06F 17/18* | (2006.01) |

(52) U.S. Cl.
CPC ............ *G06K 9/4638* (2013.01); *G06F 17/18* (2013.01); *G06F 30/13* (2020.01); *G06T 7/143* (2017.01); *G06T 17/00* (2013.01); *G06T 2207/10028* (2013.01); *G06T 2207/20076* (2013.01)

(58) Field of Classification Search
CPC ....... G06K 9/4638; G06F 30/13; G06F 17/18; G06F 30/20; G06T 17/00; G06T 7/143; G06T 2207/20076; G06T 2207/10028
See application file for complete search history.

(56) References Cited

U.S. PATENT DOCUMENTS

| | | | | |
|---|---|---|---|---|
| 9,025,861 | B2 * | 5/2015 | Furukawa | G06T 17/00 |
| | | | | 382/154 |
| 2010/0315412 | A1 * | 12/2010 | Sinha | G06T 15/00 |
| | | | | 345/419 |
| 2014/0301633 | A1 * | 10/2014 | Furukawa | G06T 17/00 |
| | | | | 382/154 |

OTHER PUBLICATIONS

European Search Report dated Mar. 11, 2017 in Application No. 17305523.7-1954, 9 pages.

(Continued)

*Primary Examiner* — Samir A Ahmed
(74) *Attorney, Agent, or Firm* — Oblon, McClelland, Maier & Neustadt, L.L.P.

(57) ABSTRACT

A computer-implemented method for determining an architectural layout. The method comprises providing a cycle of points that represents a planar cross section of a cycle of walls, and, assigned to each respective point, a respective first datum that represents a direction normal to the cycle of points at the respective point. The method also comprises minimizing a Markov Random Field energy thereby assigning, to each respective point, a respective one of the set of second data. The method also comprises identifying maximal sets of consecutive points to which a same second datum is assigned, and a cycle of vertices bounding a cycle of segments which represents the architectural layout. Such a method constitutes an improved solution for determining an architectural layout.

20 Claims, 5 Drawing Sheets

(56) References Cited

OTHER PUBLICATIONS

Kevin Lai et al., "Detection-based Object Labeling in 3D Scenes", XP32451047A, 8 pages, 2012 IEEE International Conferences on Robotics and Automation, RiverCentre, Saint Paul, Minnesota, May 14-18, 2012.

Wei Sui et al., "Layer-Wise Floorplan Extraction for Automatic Urban Building Reconstruction", XP11597014A, 17 pages, IEEE Transactions on Visualization and Computer Graphics, vol. 22, No. 3, Mar. 2016.

Xuehan Xiong et al., "Using Context to Create Semantic 3D Models of Indoor Environments", 11 pages, The Robotics Institute, Carnegie Mellon University, 2010.

Çağlar Yapicilar et al., "3D Spatial Layout Extraction of Indoor Images Using RGB-D Data", 4 pages, Istanbul, Turkey, 2013.

Scott Satkin et al., "3DNN: Viewpoint Invariant 3D Geometry Matching for Scene Understanding", 8 pages, IEEE International Conference on Computer Vision, 2013.

Liangliang Nan et al., "A Search-Classify Approach for Cluttered Indoor Scene Understanding", 10 pages, ACM Transactions on Graphics (TOG), vol. 31 Issue 6, Nov. 2012.

Young Min Kim et al., "Acquisition of 3D Indoor Environments with Variability and Repetition", 8 pages, ACM Transactions on Graphics (TOG), vol. 31 Issue 6, Nov. 1, 2012.

Claudio Mura et al., "Automatic Room Detection and Reconstruction in Cluttered Indoor Environments with Complex Room Layouts", 1 page, Computers and graphics, vol. 44 Issue C, Nov. 2014.

Moos Hueting et al., "CROSSLINK: Joint Understanding of Image and 3D Model Collections through Shape and Camera Pose Variations", 13 pages, ACM Translations on Graphics (TOG), vol. 34 Issue 6, Nov. 2015.

Alexander Hermans et al., "Dense 3D Semantic Mapping of Indoor Scenes from RGB-D Images", 8 pages, IEEE International Conference on Robotics and Automation (ICRA), May 31-Jun. 7, 2014.

Renato F. Salas-Moreno et al., "Dense Planar SLAM", 8 pages, Imperial College London, IEEE International Symposium on Mixed and Augmented Reality (ISMAR), 2014.

Richard A. Newcombe et al., "DTAM: Dense Tracking and Mapping in Real-Time" 8 pages, Department of Computing, Imperial College London, 2011 International Conference on Computer Vision, Nov. 6-13, 2011.

Qian-Yi Zhou et al., "Elastic Fragments for Dense Scene Reconstruction", 8 pages, 2013 IEEE International Conference on Computer Vision, Dec. 1-8, 2013.

Jakob Engel, "LSD-SLAM: Large-Scale Direct Monocular SLAM", 16 pages, Sep. 2014.

Jian Zhang, "Estimating the 3D Layout of Indoor Scenes and its Clutter from Depth Sensors", 8 pages, IEEE International Conference on Computer Vision, 2013.

Dahua Lin, "Holistic Scene Understanding for 3D Object Detection with RGBD cameras", 8 pages, IEEE International Conference on Computer Vision, 2013.

Thomas Whelan, "Computer Science and Artificial Intelligence Laboratory Technical Report-Kintinuous: Spatially Extended KinectFusion", 10 pages, Jul. 19, 2012.

Petri Tanskanen, "Live Metric 3D Reconstruction on Mobile Phones", 8 pages, IEEE International Conference on Computer Vision, 2013.

Yasutaka Furukawa, "Reconstructing Building Interiors from Images", 8 pages, IEEE 12$^{th}$ International Conference on Computer Vision, 2009.

Chenxi Liu, "Rent3D: Floor-Plan Priors for Monocular Layout Estimation", 9 pages, IEEE Conference on Computer Vision and Pattern Recognition (CVPR), Jun. 7-12, 2015.

Sungjoon Choi, "Robust Reconstruction of Indoor Scenes", 1 page, IEEE Conference on Computer Vision and Pattern Recognition (CVPR), Jun. 7-12, 2015.

Hema Swetha Koppula, "Semantic Labeling of 3D Point Clouds for Indoor Scenes", 9 pages, Proceedings of the 24$^{th}$ International Conference on Neural Information Processing Systems, Dec. 12-15, 2011.

Renato F. Salas-Moreno, "SLAM++: Simultaneous Localisation and Mapping at the Level of Objects", 8 pages, IEEE Conference on Computer Vision and Pattern Recognition (CVPR), Jun. 23-28, 2013.

Wongun Choi, "Understanding Indoor Scenes using 3D Geometric Phrases", 8 pages, IEEE Conference on Computer Vision and Pattern Recognition (CVPR), Jun. 23-28, 2013.

* cited by examiner

DETERMINING AN ARCHITECTURAL LAYOUT

CROSS-REFERENCE TO RELATED APPLICATIONS

This application claims priority under 35 U.S.C. § 119 or 365 to European Application No. EP 17305523.7, filed May 9, 2017. The entire contents of the above application(s) are incorporated herein by reference.

FIELD OF THE INVENTION

The invention relates to the field of computer programs and systems, and more specifically to a method, system and program for determining an architectural layout.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In this context and other contexts, scene understanding and semantic extraction in a 3D point cloud are gaining wide importance.

Different algorithms have been developed in order to reconstruct in 3D an environment, such as a room. This is notably the case of the solutions described in the following papers, which are based on using an RGB camera:

R. Newcombe, S. Lovegrove, A. Davison, "DTAM: Dense Tracking and Mapping in Real-Time", in ICCV 2011.

P. Tanskanen, K. Kolev, L. Meier, F. Camposeco, O. Saurer, M. Pollefeys, "Live Metric 3D Reconstruction on Mobile Phones", in ICCV 2013.

J. Engel, T. Schöps, D. Cremers, "LSD-SLAM: Large-Scale Direct Monocular SLAM", in ECCV 2014.

This is also the case of the solutions described in the following papers, which are based on using an RGB-depth camera:

T. Whelan, J. McDonald, M. Kaess, M. Fallon, H. Johannsson, J. Leonard, "Kintinuous; Spatially Extended Kinect-Fusion", in MIT Technical Report, 2012.

Q. Zhou, S. Miller, V. Koltun, "Elastic Fragments for Dense Scene Reconstruction", in ICCV 2013.

S. Choi, Q. Zhou, V. Koltun, "Robust Reconstruction of Indoor Scenes", in CVPR 2015.

Many of these algorithms still produce noisy raw 3D data, like 3D point clouds or simple meshes. It may be hard to exploit such a 3D reconstruction in high level applications. More information may be needed to exploit a virtual environment, such as a segmentation of the objects and canonical shapes (e.g. planes) inside the scene, a classification of each object, a retrieval of each object in a 3D database, a semantic associated to the layout of the scene, a scene graph, etc. These complex tasks constitute the so-called Scene Understanding problem in the literature, addressed notably in the following papers:

H. Koppula, A. Anand, T. Joachims, A. Saxena, "Semantic Labeling of 3D Point Clouds for Indoor Scenes", in NIPS 2011.

L. Nan, K. Xie, A. Sharf, "A Search-Classify Approach for Cluttered Inddor Scene Understanding", in SIGGRAPH Asia 2012.

W. Choi, Y. Chao, C. Pantofaru, S. Savarese, "Understanding Indoor Scenes Using 3D Geometric Phrases", in CVPR 2013.

D. Lin, S. Fidler, R. Urtasun, "Holistic Scene Understanding for 3D Object Detection with RGBD Cameras", in ICCV 2013.

S. Satkin, M. Hebert, "3DNN: Viewpoint Invariant 3D Geometry Matching for Scene Understanding", in ICCV 2013.

M. Hueting, M. Ovsjanikov, N. Mitra, "CrossLink: Joint Understanding of Image and 3D Model Collections through Shape and Camera Pose Variations", in SIGGRAPh Asia 2015.

Some recent advances provide ways to perform a scene understanding task during the 3D reconstruction process. This is notably the case in the following papers:

Y. Furukawa, B. Curless, S. Seitz, "Reconstructing Building Interiors from Images", in ICCV 2009.

Y. Kim, N. Mitra, D. Yan, L. Guibas, "Acquiring 3D Indoor Environments with Variability and Repetition", in SIGGRAPH Asia 2012.

R. Salas-Moreno, R. Newcombe, H. Strasdat, P. Kelly, A. Davison, "SLAM++: Simultaneous Localisation and Mapping at the Level of Objects", in CVPR 2013.

R. Salas-Moreno, B. Glocker, P. Kelly, A. Davison, "Dense Planar SLAM", in ISMAR 2014.

Hermans, G. Floros, B. Leibe, "Dense 3D Semantic Mapping of Indoor Scenes from RGB-D Images", in ICRA 2014.

Nevertheless, these known solutions mainly remain limited to the recognition and clustering of the objects, as well as the segmentation of planes constituting the 3D scene. That is why scene understanding is usually performed on complete data, once the 3D reconstruction is done.

Now, solutions that aim in specific at extracting the layout of a 3D reconstructed indoor scene also exist. Such a determination of an architectural layout has many applications in Scene Modeling, Scene Understanding, Augmented Reality, and all domains where it is necessary to precisely build an accurate 3D indoor scene or to get accurate measurements. Two main families of methods exist in the state of the art: methods based on learning algorithms to cluster the walls, ceiling and floor, and methods based on pure geometric hypotheses to extract the layout (for instance, the room is a cuboid, the walls are vertical and their projection is a line on the floor plan, etc).

A known solution uses a probabilistic graphical model to infer the walls, ceiling and floor, given the RGB-Depth data:

X. Xiong, D. Huber, "Using Context to Create Semantic 3D Models of Indoor Environments", in BMVC 2010.

Other papers show how to use depth and RGB data to identify the wall planes and corner edges:

ç. Yapicilar, B. Bölümü, D. Okulu, I. Türkiye, N. Arica, "3D Spatial Layout Extraction of Indoor Images using RGB-D Data", in SIU 2013.

J. Zhang, C. Kan, A. Schwing, R. Urtasun, "Estimating the 3D Layout of Indoor Scenes and its Clutter from Depth Sensors", in ICCV 2013.

The solution developed in the latter paper in particular makes the strong assumption that the layout of the indoor scene is a simple cuboid. It uses Conditional Random Fields to separate the clutter from the walls.

A solution which does not make such assumption also exists, where the layout can even be non-convex:

C. Mura, O. Mattausch, A. Villanueva, E. Gobbetti, R. Pajarola, "Automatic Room Detection and Reconstruction in Cluttered Indoor Environments with Complex Room Layouts", in Computer&Graphics 2014.

This paper aims at identifying the different rooms in the final layout of the reconstructed indoor scene. It identifies the walls despite the occlusions, and projects them on the floor plan, in order to build a cell graph which will be used to cluster the different rooms of the indoor scene. But this paper assumes that the reconstructed 3D point cloud comes from a laser scanner located inside each room at a fix position. Moreover this method is not able to detect fine details in the layout.

A solution which only uses a set of monocular images also exists, which is thus prone to many ambiguities and does not provide an absolute metric of the layout:

C. Liu, A. Schwing, K. Kundu, R. Urtasun, S. Fidler, "Rent3D: Floor-Plan Priors for Monocular Layout Estimation", in CVPR 2015.

Moreover this paper makes the strong Manhattan-world assumption, meaning that each pair of walls has to be either parallel or perpendicular. The method uses an optimization, to infer the layout of each room and to choose the room in the floor plan in which each photo was taken.

Within this context, there is still a need for an improved solution for determining an architectural layout.

SUMMARY OF THE INVENTION

It is therefore provided a computer-implemented method for determining an architectural layout. The method comprises providing a cycle of points that represents a planar cross section of a cycle of walls. The method also comprises providing, assigned to each respective point, a respective first datum that represents a direction normal to the cycle of points at the respective point. The method also comprises minimizing a Markov Random Field (MRF) energy. The MRF energy is defined on the cycle of points with labels. The labels take values in a set of second data. Each second datum represents a respective direction normal to the layout. By the minimization, the method assigns, to each respective point, a respective one of the set of second data. The MRF energy comprises a unary term. The unary term penalizes, for each point, an angular distance between the direction represented by the assigned second datum and the direction represented by the assigned first datum. The MRF energy further comprising a binary term. The binary term increasingly penalizes, for each couple of consecutive points, an angular distance between the directions represented by the assigned second data as an angular distance between the directions represented by the assigned first data decreases. The method also comprises identifying maximal sets of consecutive points to which a same second datum is assigned. The method also comprises determining a cycle of vertices bounding a cycle of segments. The cycle of segments represents the architectural layout. Each segment corresponds to a respective wall. Each segment fits a respective maximal set and is normal to the direction represented by the second datum assigned to the points of the respective maximal set.

Such a method provides an improved solution for determining an architectural layout.

Notably, thanks to the minimization of an MRF energy, the method can perform relatively robustly and/or fast. Furthermore, the specific MRF energy involved allows the method to at least reduce problems of the prior art. Relative to the prior art, the method is less prone to noisy data, the method can extract a full or at least larger layout, the method can reconstruct a precise layout (e.g. including fine details), the method may exclude making assumptions on the shape of the layout (e.g. Manhattan-world and/or cuboid assumption) or on the occlusions and/or the position of a sensor which acquired a 3D point cloud (e.g. from which the cycle of points is derived), the method may exclude the need of any color data in the provided data, the method may exclude the need to perform any prior machine learning (e.g. to learn parameters on a labeled dataset).

The method may comprise one or more of the following:
  the minimizing of the MRF energy is exact;
  the minimizing of the MRF energy is performed via one or more belief propagations;
  the first data and the second data are vectors, and the angular distance between the direction represented by an assigned second datum $N_k$ and the direction represented by an assigned first datum $n_i$ is of the type $D(x_i,k)=1-|N_k \cdot n_i|$, the angular distance between the directions represented by assigned second data $N_k$ and $N_m$ is of the type $1_{k \neq m}$, and/or the angular distance between the directions represented by assigned first data $n_i$ and $n_j$ is of the type $|n_i \cdot n_j|$;
  the MRF energy is of the type $E(l(x_0), \ldots, l(x_{n-1})) = \sum_{i=0}^{n-1} D(x_i, l(x_i)) + \lambda \sum_{i=0}^{n-1} S(x_i, x_{i+1}, l(x_i), l(x_{i+1}))$, where $\{x_0, \ldots, x_{n-1}\}$ is the cycle of points, with $i+1=0$ when $i=n-1$, $D(x_i, l(x_i))$ is the unary term, $S(x_i, x_{i+1}, l(x_i), l(x_{i+1}))$ is the binary term, and is a positive number;
  each respective vertex corresponds to a respective first point and to a respective second point, the respective first point being the ending point of the maximal set corresponding to a respective segment bounded by the respective vertex, the respective second point being the starting point of the maximal set corresponding to the respective other segment bounded by the respective vertex, the determining of the respective vertex comprising determining an initial position of the respective vertex as a function of the respective first point and the respective second point, and optimizing the initial position;
  the function of the respective first point and the respective second point is the mean function;
  the optimizing minimizes a cost function that penalizes for each respective segment a distance between a resulting value of a length of the respective segment from the initial value of the length of the respective segment;

the cycle of points is a concave hull of a 2D point cloud that corresponds to a projection of a 3D point cloud representing the cycle of walls on a projection plane, the projection plane corresponding to the planar cross section;

the projection plane represents the floor plane and/or the projection is a vertical projection;

the providing of the cycle of points comprises providing a 3D point cloud representing a room that includes the cycle of walls, identifying the projection plane and the 3D point cloud representing the cycle of walls from the 3D point cloud representing the room, projecting the 3D point cloud representing the cycle of walls on the projection plane, determining the 2D point cloud, and determining the concave hull;

the identifying of the projection plane and of the 3D point cloud representing the cycle of walls comprises detecting planes in the 3D point cloud representing the room with a random sample consensus algorithm; and/or the determining of the 2D point cloud comprises, for each detected plane, projecting the result of the projection of the plane on a linear regression of the result.

It is further provided a computer program comprising instructions for performing the method.

It is further provided a device comprising a data storage medium having recorded thereon the computer program. The device may form a non-transitory computer-readable medium. The device may alternatively comprise a processor coupled to the data storage medium. The device may thus form a system. The system may further comprise a graphical user interface coupled to the processor. The system may further comprise and/or be connectable and/or connected to one or more sensor(s) coupled to the processor and configured to capture a 3D point cloud representing a room and from which the cycle of points may be determined. The sensor(s) may include one or more transportable sensor(s). The sensor(s) may include one or more depth sensor(s), RGB-depth sensor(s) and/or one or more laser scanner(s).

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
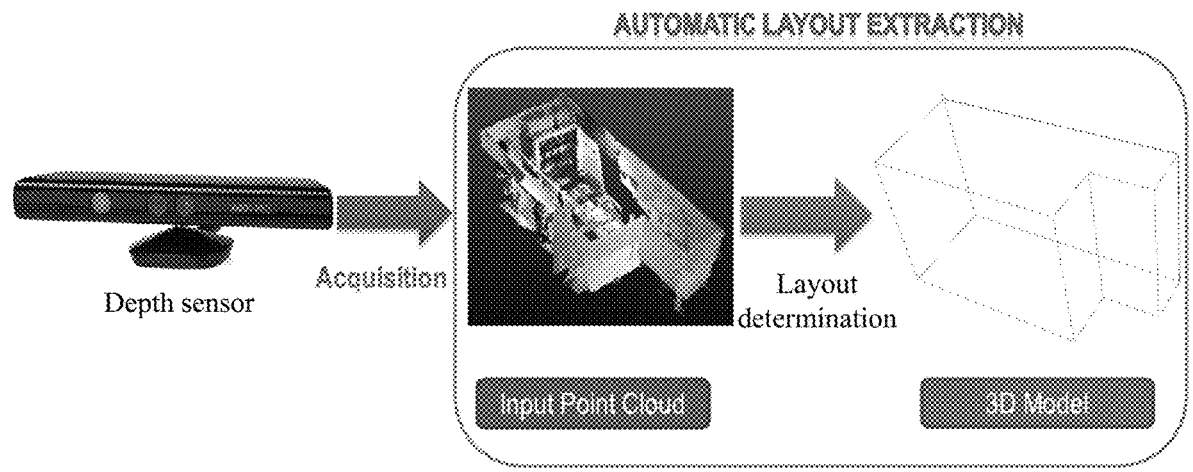
FIGS. 1, 2, 3, 4, 5, 6, 7, 8 and 9 illustrate examples of the method.

The term "datum" designates a piece of data. The term "data" designates a plurality of such pieces of data.

The term "cycle" corresponds to the mathematical notion of "cyclic set". A wall is a quadrilateral material structure. A cycle of walls is a (e.g. finite) set of such quadrilaterals connected edge-by-edge, each quadrilateral being connected to exactly two other quadrilaterals on opposite edges, so that the set forms a ring. The cycle of walls may correspond to the walls of a room. The room also includes a floor, and may optionally also include a ceiling or alternatively be open on its upper side. The walls of a room may be the quadrilateral panel structure on the floor, for example between the floor and a ceiling. Such walls may comprise apertures (such as windows, doors, or other holes). The walls may in examples be vertical. In such a case the points may stem from a vertical projection of a 3D point cloud representing the walls on a horizontal plane, the planar cross section being a horizontal cross section, for example corresponding to the floor plane.

The cycle of walls may form a structure different from a cuboid. The cycle of walls may comprise pairs of consecutive walls which are connected at an angle different from 90°. The cycle of walls may comprise a number of walls different from 4.

The expression "architectural layout" designates information representing the way architectural structures are arranged. The cycle of vertices determined by the method corresponds to a cycle of segments, each segment being bounded and thus defined by a pair of consecutive vertices of the cycle of vertices, and each segment corresponds to a respective wall of the cycle of walls. Thus, the cycle of vertices represents the arrangement between the walls. Such relatively fine information represents an architectural layout, as opposed to the provided cycle of points which may represent the planar cross section of the cycle of walls in a raw manner.

The method may further determine a 3D layout, for example corresponding to an extrusion of the cycle of segments, for example between a floor plane and a ceiling plane which may be pre-provided or determined within the method.

The first data may be determined, for example at an initial stage of the method, for example based (e.g. solely) on the cycle of points. A first datum represents a direction normal to the cycle of points at the respective point. The first datum may approximate the real normal of the cross section of the wall at the respective point. The first datum may be a vector. The first datum may represent a direction normal to a segment bounded by two points each on a respective side of the respective point, for example two points on a graph corresponding to the cycle of points which are below a distance threshold (relative to the respective point), for example each at a distance exactly equal to the threshold. The distance may be a graph distance. The two points may for example be the two points adjacent to the respective point in the cycle of points. In a cycle, two adjacent elements are by definition two elements where one is consecutive to the other in the cycle.

A second datum represents a respective direction normal to the layout at the point to which it is assigned. The second data may be vectors, as the first data. The set of second data may be smaller than the set of first data. The labels take values in a set of second data which may be finite and/or predetermined. The set of second data may correspond to a—e.g. regular—sampling of a range of angles, e.g. [0°, 360°] or [0°, 180°], each angle defining a direction relative to any common reference axis or vector (which may be arbitrary). The sampling may comprise the value 0°, a number of values lower or equal to 360, 180, 90, 45, 30, 15, and/or a number of values higher or equal to 1, 2, 4 or 10. The sampling may e.g. be {0°, 45°, 90°, 135°} or {0°, 15°, 30°, 45°, 60°, 75°, 90°, 105°, 120°, 135°, 150°, 165°}.

The minimizing of the MRF energy may be an exact minimization or a pseudo minimization. The method in essence aims at cleaning, correcting and/or organizing the rough information provided by the first data into information which allow identifying walls. The MRF operates such cleaning, correction and/or organization thanks to penalization terms that take into account the first data.

The unary term penalizes, for each point, an angular distance between the direction represented by the assigned second datum and the direction represented by the assigned first datum. In other words, the MRF minimization tends to assign to each point a second datum representing a direction close to the one represented by its already assigned first datum. The unary term thus constitutes a cost function which is an increasing function of the angular distance. The increasing is not necessarily strict, but the cost function is not constant.

The binary term increasingly penalizes, for each couple of consecutive points, an angular distance between the directions represented by the assigned second data as an angular distance between the directions represented by the assigned first data decreases. In other words, the MRF minimization tends to assign to two consecutive points second data representing directions close one to the other, at least when their first data represent directions that are close one to the other. The binary term thus constitutes a cost function which is, for a given value of the angular distance between the directions represented by the assigned second data, a decreasing function of the angular distance between the directions represented by the assigned first data, and, for a given value of the angular distance between the directions represented by the assigned first data, an increasing function of the angular distance between the directions represented by the assigned second data. Said increasing and decreasing are not necessarily strict, but for at least one given value of the angular distance between the directions represented by the assigned first data, the increasing function is not constant.

A maximal set of consecutive points to which a same second datum is assigned is for any given point, the largest set of consecutive points including the given point assigned with the same second datum which is assigned to the given point.

The maximal sets are fitted with segments (bounded by the determined vertices). This means that the vertices are determined such that segments are each localized at a position corresponding to the points of a respective maximal set. The fitting may correspond to any such positioning, provided that the segment is normal to the direction represented by the second datum assigned to the points of the respective maximal set. An example is provided later.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

The method generally manipulates modeled objects. A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task).

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The method may be applied to extract the full layout of a room, for example rather than to just cluster the walls from the clutter or extract a partial layout. The method may exclude any learning step from labeled training samples. The method may exclude the use of any RGB data, as the method may work on uncolored point clouds. The method is robust to noise in the input data. The method may be applied with any 3D point cloud reconstructed with any sensor or algorithm. The method may exclude making any strong assumptions on the layout. The layout does not need to correspond to a cuboid or to respect the Manhattan-world assumption, and it can be non-convex. The extracted layout can contain fine details in the architecture. The algorithm underlying the method may be constrained to provide a layout whose possible angles between the walls belong to a finite specified set (e.g. {0°, 45°, 90°, 135°}), for example in order to enforce what may be considered as a plausible and accurate layout. The method may also provide an accurate metric in the final layout, given the 3D reconstructed scene owns such a metric.

The method may form a robust approach and be implemented by a system or device that may take as input a 3D point cloud of an indoor room, without color, and extract automatically a layout from it, even in the presence of noise in the point cloud. The outputted inner angles of the layout's walls may be relatively highly accurate.

FIG. 1 shows an example of a process which integrates the method.

The process of FIG. 1 comprises operating a depth sensor inside a room so as to acquire data that allow reconstructing a 3D point cloud. The 3D point cloud may then be inputted to the method to automatically extract a layout.

Figure 2:
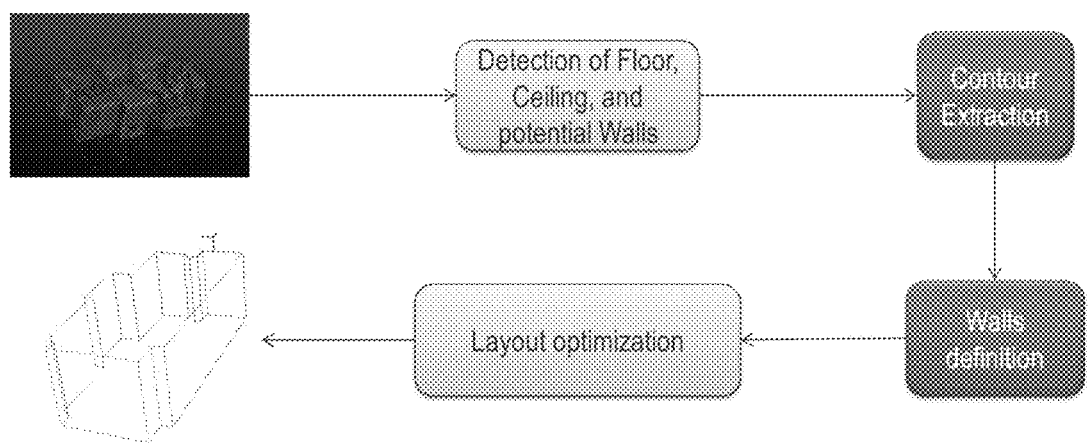

FIG. 2 shows a general view of an example of the method, that may be applied to perform the layout determination in the process of FIG. 1.

The method of FIG. 2 detects in the reconstructed 3D point cloud the walls, the ceiling, and the floor, e.g. using a planar patches extraction algorithm e.g. based on the RANSAC algorithm. Then the method of FIG. 2 extracts a contour (e.g. concave hull) of the projected point cloud e.g. on the floor plan. Next the method of FIG. 2 uses the MRF optimization to segment the identified walls of the layout, and to infer the right angles between each wall and the next wall. Then, the method of FIG. 2 further optimizes the final layout with constraints inferred by the result of the MRF optimization. The method finally outputs a polyhedral 3D layout of the indoor scene.

Figure 3:
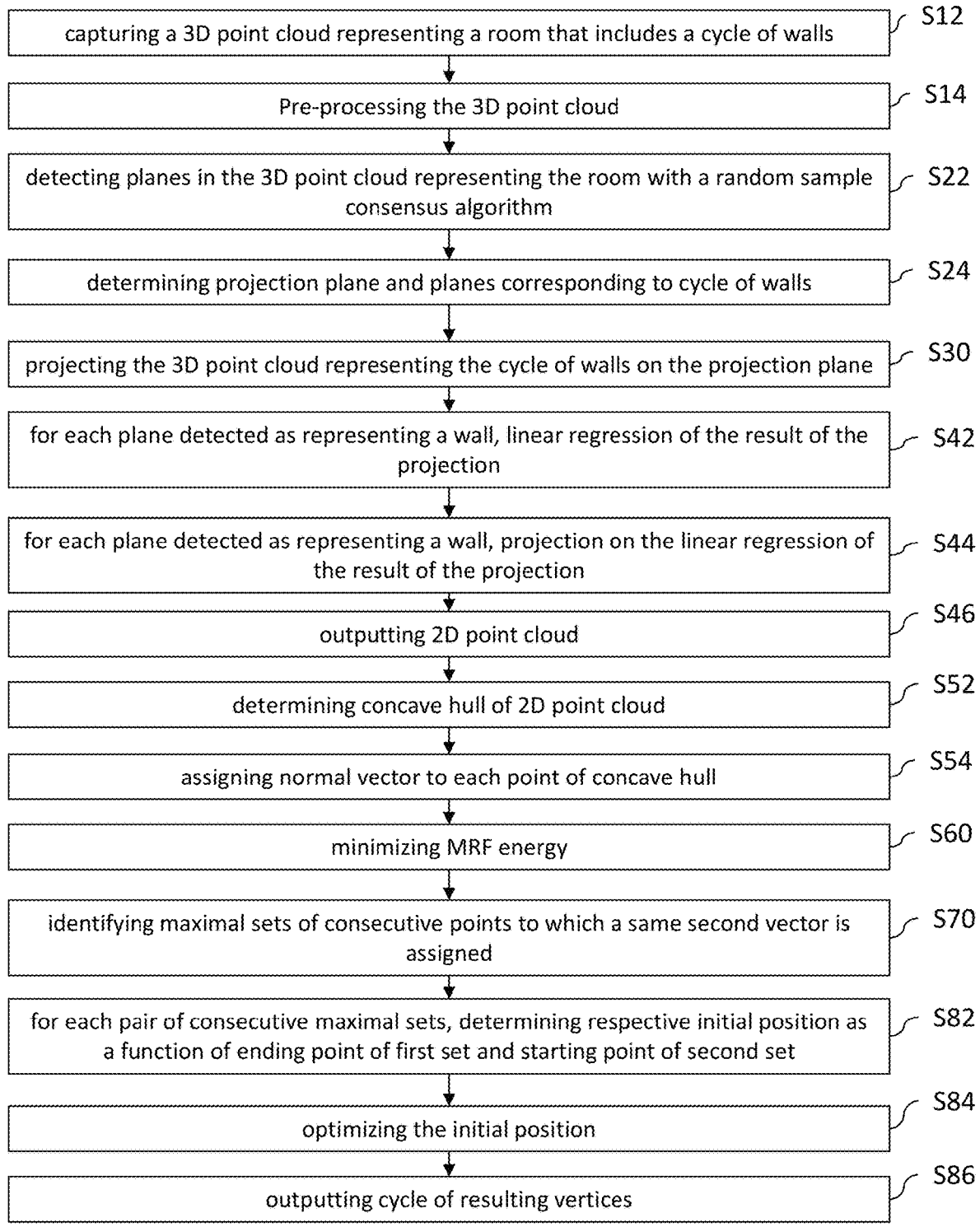

A detailed example of the method is now described with reference to the flowchart of FIG. 3. The example of the method is referred to as "the method" in the following. Steps of the method are represented sequentially on the figure, but said steps may be either sequential or interlaced.

The method comprises capturing S12 a 3D point cloud representing a room (also referred to as "scene"). The 3D point cloud may consist of a raw set of 3D points or of the vertices of a 3D mesh. The 3D point cloud may exclude any color data. The capturing S12 may be performed in any way, for example by making measurements with one or more sensors and determining the 3D point cloud from the measurements. The one or more sensors may include or consist of any sensor(s) configured for such purpose, for example non-mere RGB sensors, for example depth, RGB-depth and/or laser scan sensors. In other examples, the 3D point cloud may be provided in any other way, for example received from a distant system or retrieved in a database.

The 3D point cloud represents positions on different structures of the room, including the walls, and possibly other structures such as the floor, the ceiling, and/or any structure inside the room such as furniture or other objects. The capturing S12 may include performing measurements inside the room on said structures, for example pointing a device that includes the one or more sensors to said structures. The capturing S12 may be performed by one or more humans transporting the device inside the room and manipulating the device to perform the measurements, for example as the device is hand-carried. This offers high ergonomics. The capturing S12 may even be integrated in a global process where such human(s) transports the device inside a whole building. In such a case, the assignment of the captured data to different rooms may be performed in any way and the method may be run independently for each room.

The method then comprises an optional pre-processing S14 of the 3D point cloud. In other examples, the 3D point cloud may be inputted directly to the next step of the method. The pre-processing S14 allows the rest of the method to work on relatively clean data and thereby perform more robustly.

The pre-processing S14 may comprise filtering the input point cloud using a voxelization grid in order to get a uniform density of points in the scene. The pre-processing S14 may then apply a Principal Component Analysis (PCA) to the point cloud in order to align the main frame with its principal axes.

At this stage, a z vector may also be assigned to the 3D point cloud. For example, the z vector may by convention be set to be the principal axis associated to the lowest variance axis of the PCA. Thus the z axis now refers approximately to the vertical axis of the indoor scene, i.e. the axis orthogonal to the floor.

The method then comprises detecting S22 (e.g. all) planes in the 3D point cloud representing the room, with a random sample consensus algorithm in the example but alternatively with any other algorithm configured for that.

The random sample consensus algorithm may be as described in the following paper:

R. Hartley, A. Zisserman, "Multiple View Geometry in Computer Vision", in Cambridge University Press 2003.

The next step consists in determining S24 the candidate walls in all these planes detected by the RANSAC algorithm and a projection plane. The projection plane may be selected among the ceiling and the floor, which may optionally also be determined at S24 and outputted to the remainder of the method. Alternatively, the projection plane may be computed based on the determined candidate walls for example as an orthogonal plane.

In a particularly efficient example, the method may identify the planes that are possibly walls by selecting the planes whose normal and the z vector form an angle greater than a predetermined threshold (e.g. higher than 50° or 60°, for example 75°). The ceiling may be identified as being the plane which has the highest centroid along the z axis, of all the planes whose normal and the z vector form an angle lower than a predetermined threshold (e.g. lower than 50° or 40°, for example 20°). The floor may be identified as being the plane which has the lowest centroid along the z axis, of all the planes whose normal and the z vector form an angle lower than a predetermined threshold (e.g. lower than 50° or 40°, for example 20°). Finally, the method may optionally run a simple Euclidean clustering using a kd-Tree to split the candidate walls in different consistent planar patches, and thus get more accurate candidate walls.

As can be noticed, the algorithm may detect candidate walls inside the room which are actually not walls. Also, the floor and the ceiling may be inverted, as at this stage the method does not know if the z axis points towards the ceiling or the floor. But these are not issues thanks to later steps of the method.

Figure 4:

FIG. 4 shows the result of performing S14-S24 to the 3D point cloud illustrated on FIGS. 1-2.

The method then comprises projecting S30 the 3D point cloud representing the cycle of walls on the projection plane, for example the floor plane. The projection S30 may be vertical. In other words, the method projects the points belonging to the candidate walls, ceiling, and floor, on the floor plane, leading to a 2D representation of the point cloud. The 2D point cloud thereby obtained is a representation seen from the above. Each projected candidate wall is now approximately a line on the floor plane.

For each plane detected as representing a wall, the method performs a linear regression S42 of the result of the projection. In other words, the method regresses e.g. by least squares the best line for each candidate wall. The method then projects S44 the 2D points of each wall on its fitted line and outputs S46 the result. This allows filtering noise in the input scan.

Figure 5:
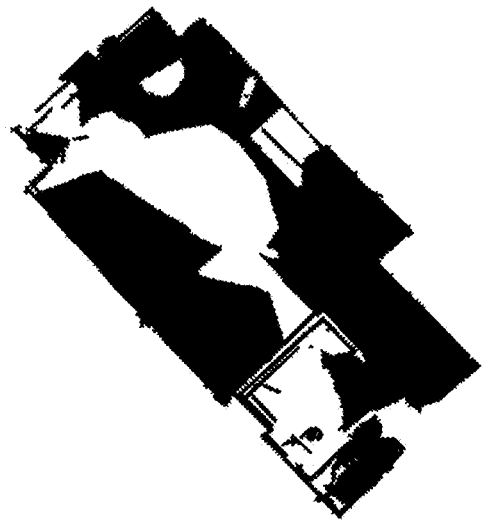

FIG. 5 shows the 3D point cloud outputted after performing S30-S46 to the 3D point cloud of FIG. 4.

The method then determines S52 a concave hull of the outputted 2D point cloud. This can be performed in any way. In alternatives to the method of FIG. 3, the concave hull is provided as such, for example received from a distant system or retrieved in a database.

In an example that was tested to provide particularly good results, the determining S52 may be performed by extracting the alpha shape of the 2D point cloud outputted at S46.

This may be performed as described in the following paper:

N. Akkiraju, H. Edelsbrunner, M. Facello, P. Fu, E. Mucke, C. Varela, "Alpha Shapes: Definition and Software", in International Computational Geometry Software Workshop 1995.

The alpha shape represents a hull of the 2D point cloud. The larger alpha is, the more convex the hull given by the alpha shape is. An efficient scheme to adjust the alpha value may be as following. The method may start from alpha=200 for a point cloud in millimeters. At the end of the whole pipeline, the method may compare the perimeter of the layout P with the length of the alpha shape L and the length of the convex hull of the projected point cloud C. If $$\frac{|L-P|}{L} > 0.15 \text{ or } \frac{|C-P|}{L} > 0.25 \text{ or } 0.95 \ C > P,$$

then the algorithm may restart from this step after increasing alpha by 100×i where i the current iteration.

Figure 6:
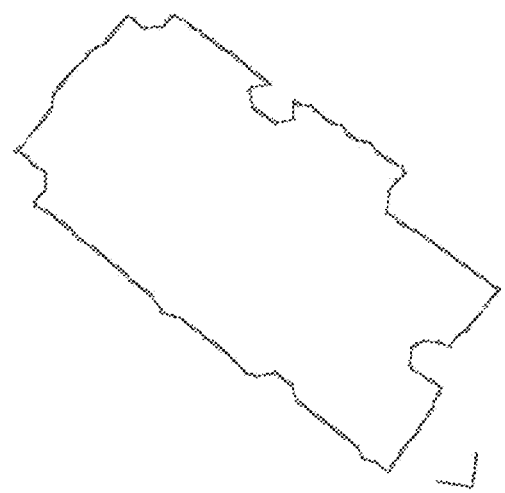

FIG. 6 illustrates such an alpha shape obtained from the 2D point cloud of FIG. 5.

The determining S52 allows to input to the MRF a clean cycle of points that represents a planar cross section of the cycle of walls along the projection (e.g. floor) plane (yet in a raw manner at this stage). The cycle of points thus forms the concave hull of a 2D point cloud, where the 2D point cloud corresponds to a projection of a 3D point cloud representing the cycle of walls on a projection plane such as the floor plane and the expression "corresponds to" encompasses the option to reduce noise by projecting points on the result of a wall-wise linear regression (as performed in S42-S44). This allows to order the walls which may be detected in an unorganized manner at S24, to discard points not corresponding to walls, and to perform the MRF robustly, even in case not all walls are detected at S24.

The method then assigns S54 to each point of the cycle of points a first datum which is a normal vector. In alternatives to the method of FIG. 3, the concave hull is already provided with such first data, for example received from a distant system or retrieved in a database. The method then minimizes S60 the MRF energy. The method may perform the assignment S54 in line with the sequence represented on FIG. 3 or interlaced with the MRF minimization S60.

An efficient implementation of S54-S60 which was tested is now provided using the following notations. In the following, indices belong to Z/nZ for convenience, so that i+1=0 when i=n−1.

Each point $x_i$ can be associated with a unit normal $n_i=u_i/\|u_i\|$ where $u_i(0)=X_{i-1}(1)-x_{i+1}(1)$ and $u_i(1)=x_{i+1}(0)-x_{i-1}(0)$. $n_i$ represents the approximate normal of the wall to which $x_i$ belongs. (0) and (1) represent the two coordinates of the 2D plan where the 2D point cloud is represented.

Then, the method may find the main mode in the distribution of these normals. For each normal $n_i$ the method may count how many other normals $n_j$ form an angle lower than a predetermined threshold (e.g. lower than 20°, e.g. 10°) with $n_i$. The method may weight the count for each $n_j$ by the length $\|x_{j-1}-x_{j+1}\|$. The method may identify and denote $N_0$ the normal associated to the highest count. $N_0$ is the normal of one of the main wall directions.

The method may consider a finite set of possible second data which are angles between each wall and its neighboring walls: $A=\{a_0, \ldots, a_{L-1}\}$, with $a_0=0°$. The more angles are allowed, the finest details the method can catch in the layout, at the cost of a higher sensitivity to the noise in the layout point cloud. The method may for example take $A=\{0°, 45°, 90°, 135°\}$ or $A=\{0°, 15°, 30°, 45°, 60°, 75°, 90°, 105°, 120°, 135°, 150°, 165°\}$, which allows to accurately model almost any layout with a high robustness to noise in the input point cloud. But no theoretical limitation prevents the method to for example discretize at a finest level, such as 1°, which gives the method 360 possible labels in set A.

Let $N_k$ be the vector $N_0$ rotated of $a_k$ degrees for all $k \in \{0, \ldots, L-1\}$. These may be the labels of the MRF.

The method may associate to the layout cycle a pairwise MRF model to infer the correct normal for each $x_i$, which is equivalent to get the segmentation and angle of each wall in the concave hull.

The data or unary term for $x_i$ associated to the label k may be equal to D $(x_i,k)=1-|N_k \cdot n_i|$.

The smoothness or binary term for two connected vertices $x_i$ with label k and $x_j$ with label m may be equal to $S(x_i, x_j, k, m) = 1_{k \neq m} |n_i \cdot n_j|$.

Let $l(x_i)$ be the label associated to the vertex $x_i$, i.e. the possible exact normals.

The MRF energy associated to the model may be equal to $E(l(x_0), \ldots, l(x_{n-1})) = \Sigma_{i=0}^{n-1} D(x_i,l(x_i)) + \lambda \Sigma_{i=0}^{n-1} S(x_i,x_{i+1}, l(x_i),l(x_{i+1}))$. $\lambda$ may be a positive number, for example higher than 0.5. $\lambda=2$ was tested.

As the graph of the MRF is a single cycle, the method may in a particular implementation solve it fast and exactly by running L belief propagations each time fixing a different label for $x_0$, which breaks down the cycle to a chain, and finally by taking the lowest energy of the L configurations.

The belief propagations may be run as described in the following paper:

J. Yedidia, W. Freeman, Y. Weiss, "Understanding Belief Propagation and Its Generalizations", in Exploring Artificial Intelligence in the New Millennium 2003.

The result of this discrete optimization yields as an output of S60 an accurate inferred normal for each vertex of the initial concave hull. Thus for each vertex, the method knows the orientation of the wall to which the vertex belongs. Whenever two adjacent vertices do not share the same normal orientation, it means to the method that they belong to two different walls, and thus the method gets the segmentation of the initial 2D hull in different walls by identifying S70 maximal sets of consecutive points to which a same second vector is assigned.

The method now has a concave hull representing approximately the floor plane. This concave hull consists in a single cycle of n 2D points $\{x_0, \ldots, x_{n-1}\}$, each associated to a respective wall.

The method may then perform a layout optimization as follows.

Let W be the number of walls inferred by the MRF. The method can model the floor plan with a polygon of W 2d points: $y_0, \ldots, y_{W-1}$.

The method may initialize S82 each $y_j$ by $y_j^0$ a function of (e.g. the mean between) the two consecutive vertices $x_i$ and $x_{i+1}$ which are respectively associated to the consecutive walls j and j+1 (as before, the indices j belong to Z/WZ for convenience).

Let $d_j = \|y_{j+1}^0 - y_j^0\|$ be the reference lengths of each wall.
Let $m_j = y_{j+1} - y_j$.

The method may optimize S84 under a constraint of orthogonality between each segment to be outputted and the second datum previously assigned to the points of the respective maximal set corresponding to said segment. The method may notably optimize S84 the polygon representing the floor plan, with a constrained optimization, to force the inner angles of the polygon to equal the angles inferred by the MRF, while preserving as much as possible the reference lengths of each wall.

An example of optimization S84 is now provided.

Let $W_j$ be the normal of the wall j which was inferred by the MRF. The method may minimize:

$$\sum_{j=0}^{W-1} (d_j - \|m_j\|)^2 \text{ under the constraint} < \frac{m_j}{\|m_j\|}, W_j > = 0 \text{ for all } j.$$

The method may alternatively minimize any other cost function that penalizes for each respective segment a distance between a resulting value of a length of the respective segment from the initial value of the length of the respective segment. In all cases, the minimization S84 may be performed under the constraint of the angles previously inferred by the MRF.

The method may solve the problem using a penalty method, minimizing a series of unconstrained problems, $$\sum_{j=0}^{W-1} (d_j - \|m_j\|)^2 + \gamma \left( < \frac{m_j}{\|m_j\|}, W_j > \right)^2,$$

starting from a very low $\gamma$ and increasing it until the constraint is met.

The penalty method may be as described in the following paper:
D. Bertsekas, "Constrained Optimization and Lagrange Multiplier Methods", in Athena Scientific 1996.

During the optimization $y_0$ and $y_1$ may be kept fixed, in order to remove the translation and rotational degrees of freedom of the layout in the optimization. Each unconstrained problem is a nonlinear least squares, which can be solved using the Levenberg-Marquardt algorithm, but a simple Gauss-Newton scheme may also work as the method is always very close of the searched minimum.

The Levenberg-Marquardt algorithm may be as described in the following paper:
D. Marquardt, "An Algorithm for Least Square Estimation of Non-Linear Parameters", in Journal of the Society for Industrial and Applied Mathematics 1963.

Once the optimization S84 is done, the method has an accurate floor plan to output S86.

In an option, the method may further use the ceiling and floor planes to compute the height of the room, and create a 3D polygonal model of the layout.

Figure 7:
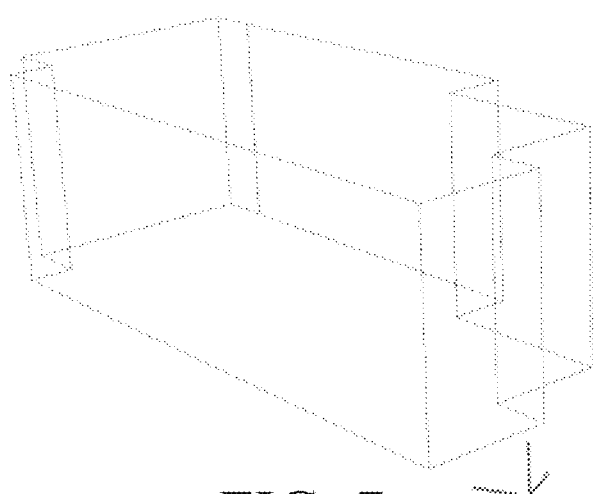

FIG. 7 shows such a 3D polygonal model created from the 2D hull of FIG. 6.

Figure 8:
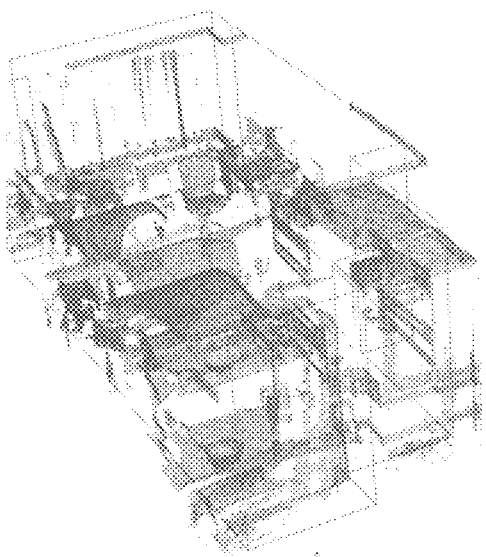

FIG. 8 shows the 3D polygonal model of FIG. 7 superposed on the initial 3D point cloud of FIGS. 1-2.

Figure 9:
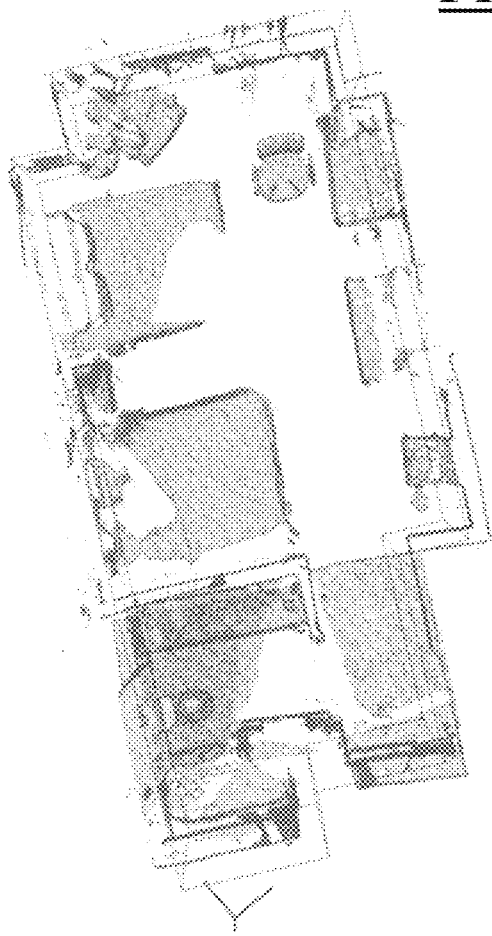

FIG. 9 shows a top view of the superposition shown on FIG. 8.

As can be seen, the 3D polygonal model visually matches the initial 3D point cloud.

Figure 10:
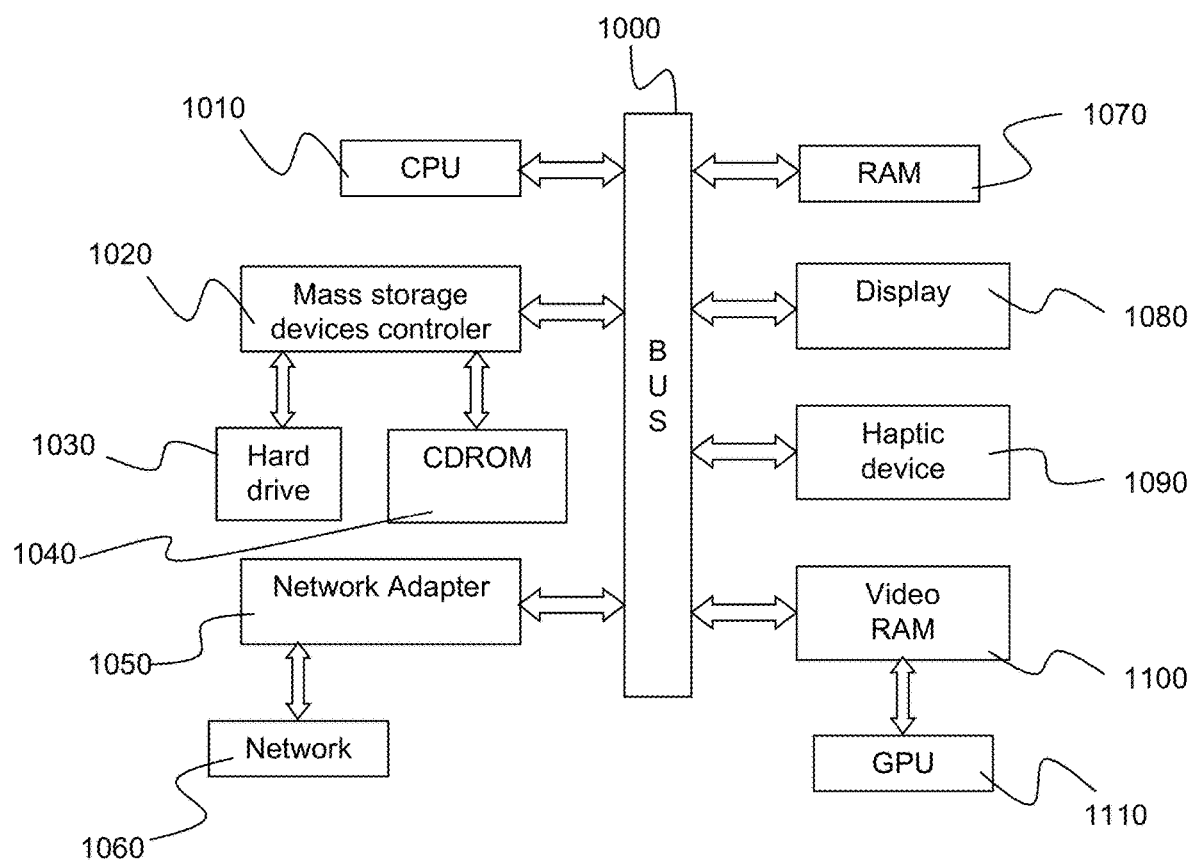
FIG. 10 shows an example of the system.

FIG. 10 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The invention claimed is:

1. A computer-implemented method comprising:
obtaining a cycle of points that represents a planar cross section of a cycle of walls, and, assigned to each respective point, a respective first datum that represents a direction normal to the cycle of points at the respective point;
minimizing a Markov Random Field (MRF) energy defined on the cycle of points with labels taking values in a set of second datum each representing a respective direction normal to an architectural layout, thereby assigning, to each respective point, a respective one of the set of second datum, the MRF energy comprising a unary term that penalizes, for each point, an angular distance between the direction represented by the assigned second datum and the direction represented by the assigned first datum, the MRF energy further comprising a binary term that increasingly penalizes, for each couple of consecutive points, an angular distance between the directions represented by the assigned second datum as an angular distance between the directions represented by the assigned first datum decreases;
identifying maximal sets of consecutive points to which a same second datum is assigned; and
determining a cycle of vertices bounding a cycle of segments that represents the architectural layout, each segment corresponding to a respective wall, each segment fitting a respective maximal set and being normal to the direction represented by the second datum assigned to respective consecutive points of respective maximal set.

2. The method of claim 1, wherein the minimizing of the MRF energy is exact.

3. The method of claim 1, wherein the minimizing of the MRF energy is performed via one or more belief propagations.

4. The method of claim 1, wherein the first datum and the second datum are vectors, and the angular distance between the direction represented by an assigned second datum $N_k$ and the direction represented by an assigned first datum $n_i$ is of the type $D(x_i,k)=1-|N_k \cdot n_i|$, the angular distance between the directions represented by assigned second datum $N_k$ and $N_m$ is of the type $1_{k \neq m}$, and/or the angular distance between the directions represented by assigned first datum $n_i$ and $n_j$ is of the type $|n_i \cdot n_j|$.

5. The method of claim 4, wherein the MRF energy is of the type $E(l(x_0), \ldots, l(x_{n-1}))=\Sigma_{i=0}^{n-1}D(x_i,l(x_i))+\lambda \Sigma_{i=0}^{n-1}S(x_i,x_{i+1},l(x_i),l(x_{i+1}))$, where:
$\{x_0, \ldots, x_{n-1}\}$ is the cycle of points, with $i+1=0$ when $i=n-1$,
$D(x_i,l(x_i))$ is the unary term,
$S(x_i,x_{i+1},l(x_i),l(x_{i+1}))$ is the binary term, and
$\lambda$ is a positive number.

6. The method of claim 1, wherein each respective vertex corresponds to a respective first point and to a respective second point, the respective first point being the ending point of the maximal set corresponding to a respective segment bounded by the respective vertex, the respective second point being the starting point of the maximal set corresponding to the respective other segment bounded by the respective vertex, the determining of the respective vertex comprising:
determining an initial position of the respective vertex as a function of the respective first point and the respective second point; and
optimizing the initial position.

7. The method of claim 6, wherein the function of the respective first point and the respective second point is the mean function.

8. The method of claim 6, wherein the optimizing minimizes a cost function that penalizes for each respective segment a distance between a resulting value of a length of the respective segment from the initial value of the length of the respective segment.

9. The method of claim 1, wherein the cycle of points is a concave hull of a 2D point cloud that corresponds to a projection of a 3D point cloud representing the cycle of walls on a projection plane, the projection plane corresponding to the planar cross section.

10. The method of claim 9, wherein the projection plane represents the floor plane and/or the projection is a vertical projection.

11. The method of claim 9, wherein the obtaining of the cycle of points comprises:
obtaining a 3D point cloud representing a room that includes the cycle of walls;
identifying the projection plane and the 3D point cloud representing the cycle of walls from the 3D point cloud representing the room;
projecting the 3D point cloud representing the cycle of walls on the projection plane;
determining the 2D point cloud; and
determining the concave hull.

12. The method of claim 11, wherein the identifying of the projection plane and of the 3D point cloud representing the cycle of walls comprises detecting planes in the 3D point cloud representing the room with a random sample consensus algorithm.

13. The method of claim 12, wherein the determining of the 2D point cloud comprises, for each detected plane, projecting the result of the projection of the plane on a linear regression of the result.

14. A non-transitory computer-readable medium having stored thereon a computer program comprising instructions for performing a computer-implemented method, the method comprising:
obtaining a cycle of points that represents a planar cross section of a cycle of walls, and, assigned to each respective point, a respective first datum that represents a direction normal to the cycle of points at the respective point;
minimizing a Markov Random Field (MRF) energy defined on the cycle of points with labels taking values in a set of second datum each representing a respective direction normal to an architectural layout, thereby assigning, to each respective point, a respective one of the set of second datum, the MRF energy comprising a unary term that penalizes, for each point, an angular distance between the direction represented by the assigned second datum and the direction represented by the assigned first datum, the MRF energy further comprising a binary term that increasingly penalizes, for each couple of consecutive points, an angular distance between the directions represented by the assigned second datum as an angular distance between the directions represented by the assigned first datum decreases;
identifying maximal sets of consecutive points to which a same second datum is assigned; and
determining a cycle of vertices bounding a cycle of segments that represents the architectural layout, each segment corresponding to a respective wall, each segment fitting a respective maximal set and being normal to the direction represented by the second datum assigned to respective consecutive points of the respective maximal set.

15. A computer system comprising
a processor coupled a memory, the memory having stored thereon a computer program comprising instructions for performing a computer-implemented method that when implemented by the processor cause the processor to be configured to:
obtain a cycle of points that represents a planar cross section of a cycle of walls, and, assigned to each respective point, a respective first datum that represents a direction normal to the cycle of points at the respective point,
minimize a Markov Random Field (MRF) energy defined on the cycle of points with labels taking values in a set of second datum each representing a respective direction normal to an architectural layout, thereby assigning, to each respective point, a respective one of the set of second datum, the MRF energy comprising a unary term that penalizes, for each point, an angular distance between the direction represented by the assigned second datum and the direction represented by the assigned first datum, the MRF energy further comprising a binary term that increasingly penalizes, for each couple of consecutive points, an angular distance between the directions represented by the assigned second datum as an angular distance between the directions represented by the assigned first datum decreases, identify maximal sets of consecutive points to which a same second datum is assigned, and
determine a cycle of vertices bounding a cycle of segments that represents the architectural layout, each segment corresponding to a respective wall, each segment fitting a respective maximal set and being normal to the direction represented by the second datum assigned to respective consecutive points of the respective maximal set.

16. The system of claim 15, wherein the minimizing of the MRF energy is exact.

17. The system of claim 15, wherein the minimizing of the MRF energy is performed via one or more belief propagations.

18. The system of claim 15, wherein the first datum and the second datum are vectors, and the angular distance between the direction represented by an assigned second datum $N_k$ and the direction represented by an assigned first datum $n_i$ is of the type $D(x_i,k)=1-|N_k \cdot n_i|$, the angular distance between the directions represented by assigned second datum $N_k$ and $N_m$ is of the type $1_{k \neq m}$, and/or the angular distance between the directions represented by assigned first datum $n_i$ and $n_j$ is of the type $|n_i \cdot n_j|$.

19. The system of claim 18, wherein the MRF energy is of the type $E(l(x_0), \ldots, l(x_{n-1}))=\Sigma_{i=0}^{n-1}D(x_i,l(x_i))+\lambda \Sigma_{i=0}^{n-1}S(x_i,x_{i+1}))$, where:
{$x_0, \ldots, x_{n-1}$} is the cycle of points, with $i+1=0$ when $i=n-1$,
$D(x_i,l(x_i))$ is the unary term,
$S(x_i,x_{i+1},l(x_i),l(x_{i+1}))$ is the binary term, and
$\lambda$ is a positive number.

20. The system of claim 15, wherein each respective vertex corresponds to a respective first point and to a respective second point, the respective first point being the ending point of the maximal set corresponding to a respective segment bounded by the respective vertex, the respective second point being the starting point of the maximal set corresponding to the respective other segment bounded by the respective vertex, the processor is configured to determine the respective vertex by being further configured to:
determine an initial position of the respective vertex as a function of the respective first point and the respective second point, and
optimize the initial position.

* * * * *